United States Patent [19]

Takano et al.

[11] Patent Number: 5,692,913
[45] Date of Patent: Dec. 2, 1997

[54] PC CARD

[75] Inventors: Yasunari Takano; Hidehiro Nakamura; Shin Yoshida, all of Miyagi-ken, Japan

[73] Assignee: Alps Electric Co., Ltd., Tokyo, Japan

[21] Appl. No.: 612,706

[22] Filed: Mar. 8, 1996

[30] Foreign Application Priority Data

Mar. 14, 1995 [JP] Japan .................................. 7-054460

[51] Int. Cl.[6] .................................................. H01R 9/09
[52] U.S. Cl. ........................ 439/80; 439/79; 439/633; 361/785; 361/748; 361/756
[58] Field of Search .......................... 439/79, 83, 80, 439/633; 361/748, 752, 756, 791, 802, 785

[56] References Cited

U.S. PATENT DOCUMENTS 5,242,310  9/1993  Leung ........................... 439/76

FOREIGN PATENT DOCUMENTS 63-45584  2/1988  Japan .

*Primary Examiner*—Leo P. Picard
*Assistant Examiner*—David Foster
*Attorney, Agent, or Firm*—Guy W. Shoup; Patrick T. Bever

[57] ABSTRACT

A PC card wherein a housing of a socket connector is provided with a guide boss and a stopper protruding on the circuit board side, and with a cutout for fitting the guide boss in the circuit board. In this cutout the guide boss is fitted to position the socket connector in the direction of x. And the forward end of this stopper is held in contact with the circuit board to position in the direction of y, thus facilitating positioning of a socket connector in relation to a circuit board without a fear of socket connector displacement in subsequent processes.

3 Claims, 3 Drawing Sheets

PC CARD

BACKGROUND OF THE INVENTION

The present invention relates to a PC card which is also called a memory card and, more particularly, to a connector positioning structure for positioning a socket connector to be installed in the PC card, in relation to a circuit board.

Inside the PC card to be inserted for use in a notebook type personal computer, a socket connector having a multitude of socket contacts fixed in a predetermined configuration in an insulated housing and a circuit board to which a terminal section of each socket contact is connected by soldering are installed, thereby enabling insertion of contact pins of an external apparatus into each socket contact from the forward end side of the socket connector. From the rear end face of the socket connector a multitude of terminal sections of each socket contact are protruding in parallel with each other. The rear end face of the socket contact is set in a specific position opposite to the forward end face of the circuit board, and the terminal section of each socket contact is attached by soldering to a land pattern corresponding to the circuit board; and the housing is supported by a supporting member, thereby securing in the PC card the socket connector properly connected to the circuit board.

Since the terminal sections of each socket contact are arranged at as narrow a pitch as 1.27 mm, the socket connector is positioned in a proper position without displacement in relation to the circuit board while holding the housing with a special positioning jig when the socket connector is connected to the circuit board.

In the prior art PC card assembling process the use of a positioning jig is needed to install the socket connector as described above. However, because the jig is removed after positioning, a low assembling efficiency will result; and moreover there is a fear that connector displacement will occur in a subsequent process.

SUMMARY OF THE INVENTION

In view of the above-described disadvantage inherent in the heretofore known technique, the present invention has an object to provide a PC card which enables easy positioning of the socket connector in relation to the circuit board without any displacement of the socket connector in subsequent processes.

To accomplish the object, the PC card of the present invention is provided with a guide boss protruding on the circuit board side, on the socket connector housing, and a cutout for fitting the guide box in the circuit board, and dimensions of the cutout and the guide boss are set so that the movement of the guide boss fitted in the cutout will be restricted at least in the direction of arrangement of the socket contact. Separately from the guide boss, there may be provided a stopper on the housing of the socket connector, protruding on the circuit board side into contact at the forward end with the circuit board.

The socket connector can be positioned at least along the direction of arrangement of the socket contact in relation to the circuit board by fitting the guide boss in the cutout when the socket connector is mounted in the PC card assembling process. It is, therefore, possible to properly position the terminal section of each socket contact on the land pattern corresponding to the circuit board. This positioning work can be done without using any positioning jig and no displacement will occur in subsequent processes.

Furthermore, the socket connector, when mounted with the stopper in contact with the circuit board, is positioned in a direction intersecting the direction of arrangement of the socket contact in relation to the circuit board; therefore the rear end face of the socket connector can be set so far from the circuit board that flux will not rise to reach the housing interior in the soldering process, by setting a proper amount of protrusion of the stopper.

The foregoing object and other objects of the present invention will become more apparent and understandable from the following detailed description thereof, when read in connection with the accompanying drawings.

DETAILED DESCRIPTION OF THE PREFERRED EMBODIMENT

Hereinafter a preferred embodiment of a PC card according to the present invention will be explained with reference to the accompanying drawings.

Figure 1:
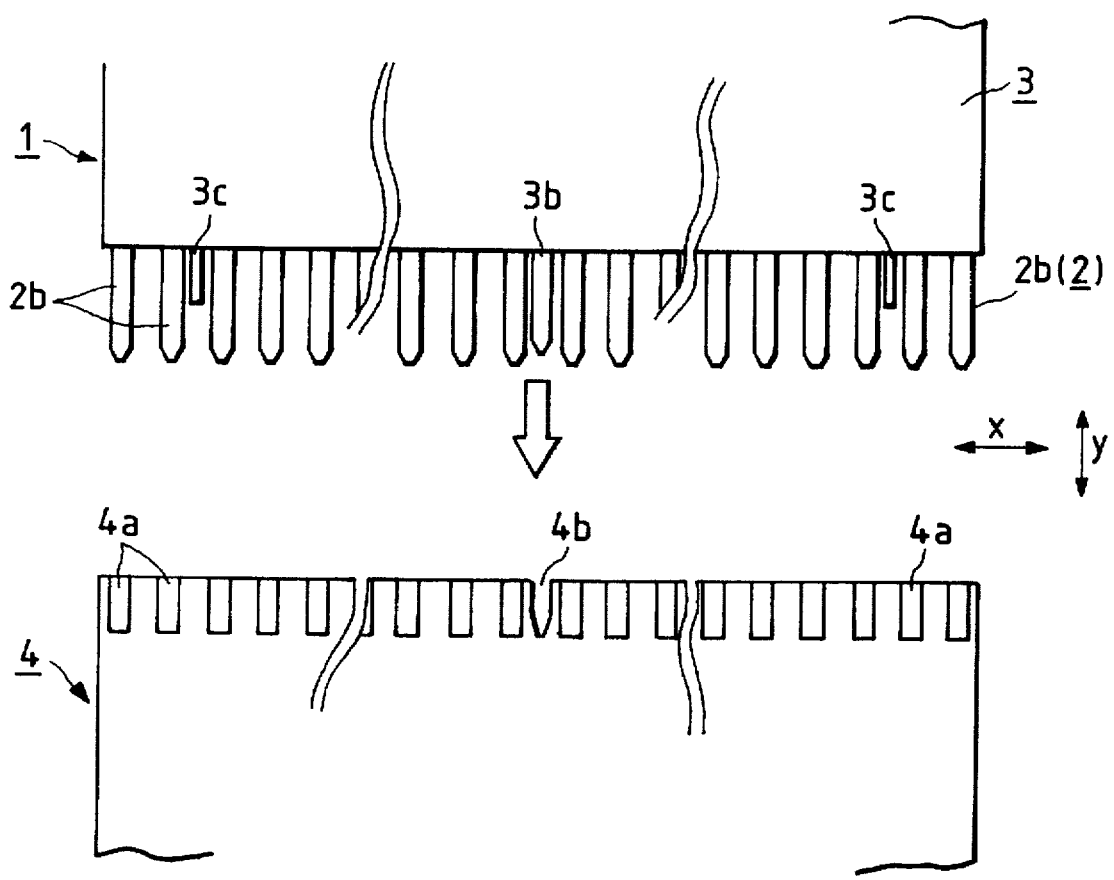
FIG. 1 is an explanatory view showing a socket connector of one embodiment to be positioned in relation to a circuit board.
Figure 2:
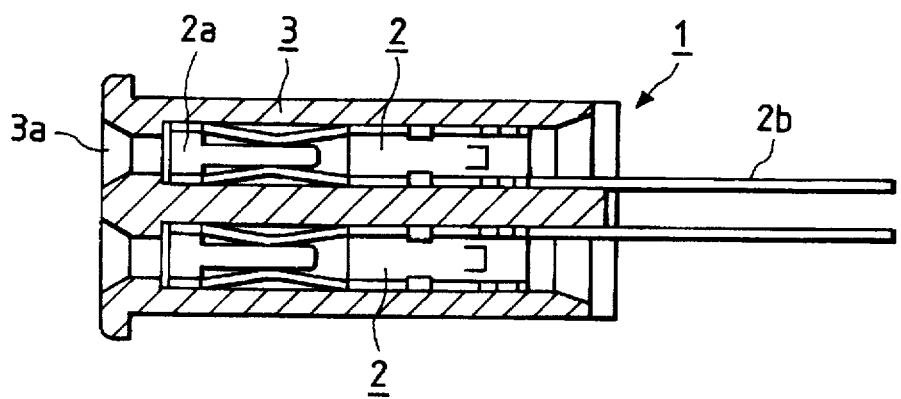
FIG. 2 is a longitudinal sectional view of the socket connector shown in FIG. 1.
Figure 3:
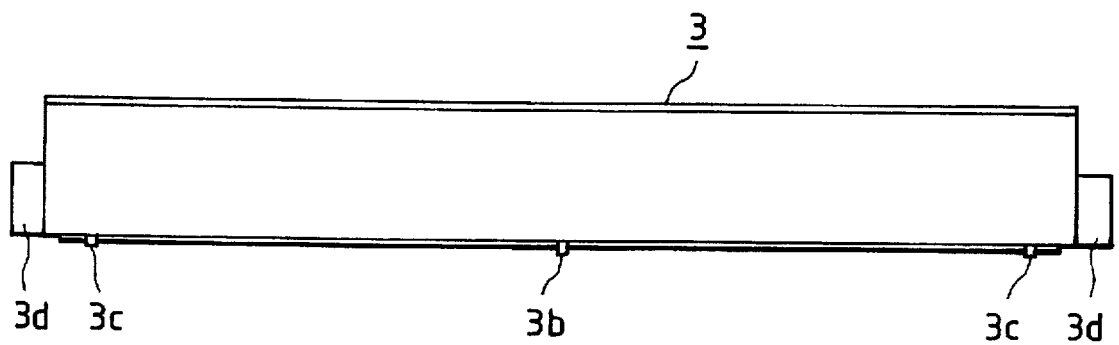
FIG. 3 is a plan view of a housing of the socket connector shown in FIGS. 1 and 2.
Figure 4:
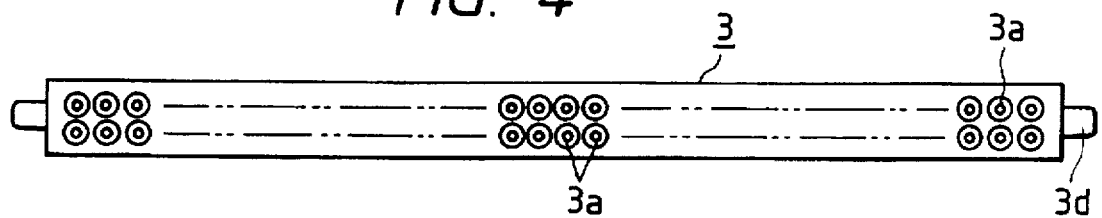
FIG. 4 is a front view of the housing shown in FIG. 3.
Figure 5:
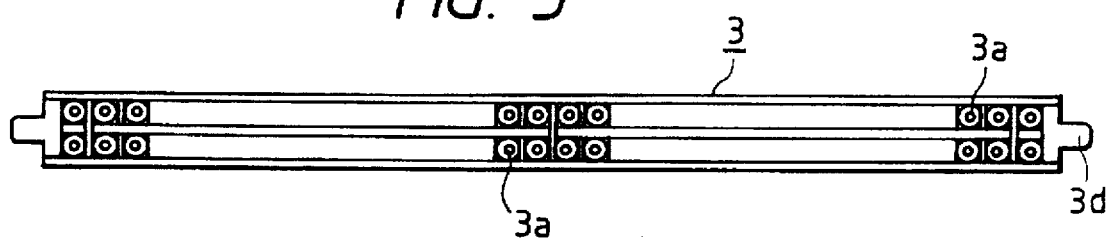
FIG. 5 is a rear view of the housing shown in FIGS. 3 and 4.
Figure 6:
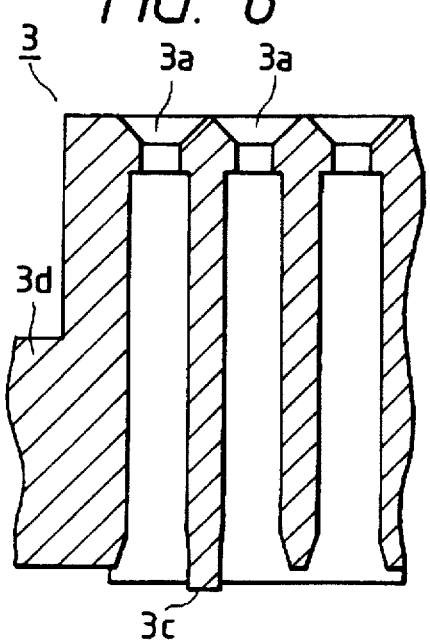
FIG. 6 is a partly cross sectional view of the housing shown in FIGS. 3, 4 and 5.

FIG. 1 is an explanatory view showing a socket connector of the PC card of one embodiment according to the present invention to be positioned in relation to a circuit board; FIG. 2 is a longitudinal sectional view of the socket connector shown in FIG. 2; FIG. 3 is a plan view of the housing of the socket connector shown in FIGS. 1 and 2; FIG. 4 is a front view of the housing shown in FIG. 3; FIG. 5 is a rear view of the housing shown in FIGS. 3 and 4; and FIG. 6 is a partly cross sectional view of the housing shown in FIGS. 3 to 5.

In these drawings, a reference numeral 1 refers generally to a socket connector, which comprises a multitude of socket contacts 2 pressed and secured in an insertion hole 3a of an insulated housing 3. In the socket housing 2, an inlet section 2a for receiving the contact pins of an external apparatus which is not illustrated is positioned in the vicinity of the forward end face of the housing 3. From the rear end face of this housing 3 a multitude of terminal sections 2b of each socket contact 2 are protruding in parallel with one another. When the PC card is assembled, the socket connector 1 is positioned and secured in the front of the circuit board 4 mounted with electronic parts not illustrated, then each terminal section 2b is connected by soldering to a land pattern 4a corresponding to the terminal section 2b. In the present embodiment, a guide boss 3b protruding on the circuit board 4 side and a pair of stoppers 3c are provided on the rear end face of the housing 3; and a cutout 4b for fitting the guide boss 3b is provided on the forward end face of the circuit board 4, thereby facilitating socket connector 1 positioning operation.

That is, the width of the cutout 4b provided at the center of the forward end face of the circuit board 4 closely agrees with (strictly speaking, a little larger than) the width of the guide boss 3b projectingly provided at the center of the rear end face of the housing 3; therefore, the guide boss 3b is fitted in this cutout 4b to thereby automatically position the housing 3 along the direction of arrangement of the socket contact 2 (in the direction of the x), and each of the terminal sections 2b can correctly be aligned on the land pattern 4a corresponding to the terminal section 2b. In the present embodiment, the forward end portion of the guide boss 3b is tapered, and therefore the guide boss 3b can quite easily be aligned and inserted into the cutout 4b.

As the socket connector 1 is brought closer toward the circuit board 4 while fitting the guide boss 3b in the cutout 4b, the approach of the housing 3 is restricted at the time when the forward end of the stopper 3c contacts the circuit board 4; therefore the socket connector 1 is positioned with respect to the circuit board 4 in a direction (y direction) intersecting the direction of arrangement of the socket contact 2, and the rear end face of the housing 3 can be set removed from the circuit board 4 by the amount of protrusion of the stopper 3c. Consequently it is possible to improve the reliability of products by setting the amount of protrusion of this stopper 3c to a size large enough to prevent the flux from reaching the inside of the housing 3 in the soldering process.

After the completion of the socket connector 1 mounting operation, such internal components as the socket connector 1 and the circuit board 4 are covered with a pair of panels which are not illustrated, thus obtaining a PC card formed as one unit in a shape of card. In the PC card the forward end face of the socket connector 1 is exposed between a pair of panels stated above, on the end face on the side of card insertion, so that a contact pin of an external apparatus can be inserted into, and removed from, each socket contact 2 in the insertion hole 3a which is open to the above-mentioned forward end face. The housing 3 of the socket connector 1 is provided with a pair of holding sections 3d protruding sideways as shown in FIGS. 3 to 5; in the PC card these holding sections 3d are supported by a supporting member not illustrated.

In the present embodiment, the socket connector 1, when mounted in the PC card assembling process, can be positioned in the direction of x by fitting the guide boss 3b in the cutout 4b of the circuit board 4. Therefore it is possible to easily and properly position the terminal section 2b of each socket contact 2 on the land pattern 4a corresponding to the circuit board 4 without using a special positioning jig and without a fear of displacement in the following processes. Furthermore, in the present embodiment, as the socket connector 1 is brought closer to the circuit board 4 while fitting the guide boss 3b in the cutout 4b, the forward end of the stopper 3c comes in contact with the circuit board 4, thus ensuring positioning in the direction of y. Therefore it is possible to set the rear end face of the socket connector 1 so far apart from the circuit board 4 that the socket connector 1 will not be affected by flux rise in the soldering process, by properly setting the amount of protrusion of the stopper 3c.

It is to be noticed that the shape and location of the stopper 3c and the guide boss 3b protrusively provided on the housing 3 are not limited to the embodiment described above. Furthermore it is possible to dispense with the stopper 3c in the above-described embodiment and also to position the socket contact 2 in both directions x and y only by means of the guide boss 3b.

According to the present invention, as explained above, it is possible to position the socket connector without using a special positioning jig, by engaging the guide boss projectingly provided on the housing with the cutout of the circuit board at the time of socket connector installation in the PC card assembling process, and to correctly align the terminal section of each socket contact on a land pattern corresponding to the circuit board, providing a large distance from a soldering point enough to protect the socket connector from flux rise at the time of soldering. Consequently, as compared with a heretofore known technique, the socket connector can easily be positioned and moreover will not move out of position in the subsequent processes, thereby presenting higher reliability and advantages.

Although a preferred embodiment has been illustrated and described herein it will be understood that the invention is susceptible of various modifications and adaptations within the scope and spirit of the appended claims.

What is claimed is:

1. A PC card comprising: a socket connector having a multitude of socket contacts arranged in a specific configuration in a housing, and a circuit board to which terminal sections of said socket contacts are to be connected; said housing having a guide boss protruding on said circuit board side; said circuit board being provided with a cutout for fitting said guide boss in said circuit board; and said cutout and said guide boss being set in dimensions to thereby restrict movement of said guide boss fitted in said cutout at least along the direction of configuration of said socket contacts.

2. A PC card as claimed in claim 1, wherein, apart from said guide boss, said housing is provided with a stopper which protrudes on said circuit board side to hold the forward end thereof in contact with said circuit board.

3. A PC card as claimed in claim 1, wherein said guide boss is set such that the protrusion length thereof is longer than the depth dimension of said cutout provided for said circuit board.

* * * * *